(12) United States Patent
Zelazo

(10) Patent No.: US 7,062,430 B2
(45) Date of Patent: Jun. 13, 2006

(54) DESIGNING BOUNDARY FILTERS FOR A BIORTHOGONAL FILTER BANK

(75) Inventor: Daniel L. Zelazo, Kasiwa (JP)

(73) Assignee: Texas Instruments Incorporated, Dallas, TX (US)

( * ) Notice: Subject to any disclaimer, the term of this patent is extended or adjusted under 35 U.S.C. 154(b) by 895 days.

(21) Appl. No.: 10/226,772

(22) Filed: Aug. 23, 2002

(65) Prior Publication Data

US 2004/0039574 A1   Feb. 26, 2004

(51) Int. Cl.
 *G10L 19/00* (2006.01)
 *G10L 21/00* (2006.01)
 *G06F 17/10* (2006.01)

(52) U.S. Cl. .................. 704/200.1; 704/204; 704/205; 704/500; 708/300

(58) Field of Classification Search ................ 704/500, 704/200, 200.1, 204, 205
See application file for complete search history.

(56) References Cited

OTHER PUBLICATIONS

Zhang, X; Yoshikawa, T., "Design of Two Channel IIR Linear Phase PR Filter Banks," Oct. 1998, ICSP '98, 1998 Fourth International Conference on Signal Processing., vol. 1, pp. 11-14.*

Okuda, M.; Ikehara, M.; Takahashi, S.; "Design of Biorthogonal Filter Banks Composed of Linear Phase IIR Filters," May 1998, ICASSP '98., Proceedings of the 1998 IEEE International Conference on Acoustics, Speech, and Signal Processing., vol. 3, pp. 1453-1456.*

(Continued)

Primary Examiner—Tālivaldis Ivars Šmits
Assistant Examiner—Donald Young
(74) Attorney, Agent, or Firm—Robert D. Marshall, Jr.; W. James Brady; Frederick J. Telecky, Jr.

(57) ABSTRACT

A signal processing device includes a biorthogonal filter bank that processes a finite length signal including a left boundary and a right boundary. The biorthogonal filter bank includes an analysis filter bank. The analysis filter bank includes one or more left boundary filters, one or more right boundary filters, and one or more steady-state analysis filters. Each left boundary filter and each right boundary filter includes a row vector. The left and right boundary filters have been designed by generating, from the steady-state analysis filters, an analysis matrix representing the analysis filter bank, multiplying the analysis matrix by a permutation matrix to generate a permuted analysis matrix, truncating the permuted analysis matrix to a degree to generate a rectangular truncated analysis matrix, and selecting a number of left boundary filters and a number of right boundary filters such that, when the row vectors corresponding to the number of left boundary filters and the number of right boundary filters are added to the truncated analysis matrix, the truncated analysis matrix becomes square. Each row vector added to the truncated analysis matrix lies outside a row space of the truncated analysis matrix such that a row vector specifies a permissible design for a boundary filter. The biorthogonal filter bank also includes a synthesis filter bank corresponding to the analysis filter bank. The synthesis filter bank includes a number of left boundary filters, a number of right boundary filters, and a number of steady-state synthesis filters. A synthesis matrix specifies the left boundary filters, right boundary filters, and steady-state synthesis filters of the synthesis filter bank. The synthesis matrix has been created by calculating the dual, or inverse, of the square analysis matrix.

48 Claims, 3 Drawing Sheets

OTHER PUBLICATIONS

Lu, S.; Antinou, A.; "Optimal Design of Two-Channel Biorthogonal Filter Banks," 2000, Eusipco, pp. 1-4.*

Robert Bristow-Johnson, *Wavetable Synthesis 101, A Fundamental Perspective*, pp. 1-23, Nov. 1996, http://www.harmony-central.com/Synth/Articles/Wavetable_101/Wavetable-101.pdf.

Ahmed H. Tewif & Murtaza Ali, *Enhanced Wavelet Based Audio Coder*, pp. 1-5, 1993, http://citeseer.nj.nec.com/cache/papers/cs/2258/ftp;zSzzSzftp.ee.umn.eduzSzpubzSztewfikzSz1993zSzaudiozSzaudio_asilomar93.pdf/tewfik93enhanced.pdf.

N. Ruiz Reyes et al., *A New Cost Function to Select the Wavelet Decomposition for Audio Compression*, pp. 1-4, Jun. 15, 2000, http://www.es.isy.liu.se/norsig2000/publ/page331_id089.pdf.

Fernando Mujica et al., *A Simple Wavelet Based Perceptual Audio Coder*, pp. 1933-1937, 1996, http://www.icspat.com/papers/481mfi.pdf.

James D. Johnston, *Estimation of Perceptual Entropy Using Noise Masking Criteria*, pp. 2524-2527, 1988 Proc. ICASSP 1988.

Pramila Srinivasan & Leah H. Jamieson, *High Quality Audio Compression Using an Adaptive Wavelet Packet Decomposition and Psychoacoustic Modelling*, pp. 100-108, 1999, IEEE Transactions on Signal Processing.

Ted Painter & Andreas Spanias et al., *Perceptual Coding of Digital Audio*, pp. 1-66, Apr. 2000, http://www.eas.asu.edu/~spanias/papers/paper-audio-tedspanias-00.pdf.

Cormac Herley, *Boundary Filters for Finite-Length Signals and Time-Varying Filter Banks*, pp. 1-35, Mar. 24, 1994, IEEE Transacations on Circuits and Systems II.

Cormac Herley et al., *Tilings of the Time-Frequency Plane: Construction of Arbitrary Orthogonal Bases and Fast Tiling Algorithms*, pp. 3341-3359, Dec. 1993, IEEE Transactions on Signal Processing.

Joao Silvestre & Luis de Sa, *Signal Extensions in Perfect Reconstruction Filter Banks*, Nov. 19, 1999, http://www.it.uc.pt/si/sipub/js96cp01.pdf.

Alfred Mertins, *Boundary Filters for Segmentation-Based Subband Coding*, pp. 151-154, Aug. 2000, 5th International Conference on Signal Processing Proceedings.

Alfred Mertins, *Boundary Filters for Size-Limited Paraunitary Filter Banks with Maximum Coding Gain and Ideal DC Behavior*, pp. 183-188, Feb. 2001, IEEE Transactions on Circuits and Systems—II: Analog and Digital Signal Processing.

Alfred Mertins & King N. Ngan, *Optimized Shape Adaptive Wavelets with Reduced Computational Cost*, pp. 616-620, Nov. 1998, Proc. ISPACS 1998, Melbourne, VIC, Australia.

Alfried Mertins, *Time-Varying and Support Perservative Filter Banks: Design of Optimal Transition and Boundary Filters Via SVD*, pp. 1316-1319, May 1995, Proc. ICASSP'95, Detroit, USA.

Alfred Mertins, *Optimized Biorthogonal Shape Adaptive Wavelets*, pp. 673-677, Oct. 1998, Proc. ICIP'98, Chicago, USA.

* cited by examiner

DESIGNING BOUNDARY FILTERS FOR A BIORTHOGONAL FILTER BANK

TECHNICAL FIELD OF THE INVENTION

This invention relates generally to designing filter banks and more particularly to designing boundary filters for a biorthogonal filter bank.

BACKGROUND OF THE INVENTION

Many applications in multi-rate digital signal processing require the analysis of input signals that are finite in length. Multi-rate filter banks provide an excellent and efficient means of analyzing input signals that are infinite in length, but have stumbled when the input signal is finite in length. Filter banks for signals finite in length have been extensively studied, and solutions to this problem include boundary filter design and signal extension techniques. Signal extension techniques are computationally simple, but generally result in an expansive filter bank (which may result in more sub-band coefficients than the original length of the input signal) and exhibit non-ideal behavior at the boundaries. Boundary filter design techniques are length-preservative, but have not guaranteed certain properties (e.g., frequency selectivity or number of vanishing moments) for a wide range of analysis filters (e.g., minimum phase filters).

SUMMARY OF THE INVENTION

Particular embodiments of the present invention may reduce or eliminate disadvantages and problems traditionally associated with designing filter banks.

In one embodiment of the present invention, a signal processing device includes a biorthogonal filter bank that processes a finite length signal including a left boundary and a right boundary. The biorthogonal filter bank includes an analysis filter bank. The analysis filter bank includes one or more left boundary filters, one or more right boundary filters, and one or more steady-state analysis filters. Each left boundary filter and each right boundary filter includes a row vector. The left and right boundary filters have been designed by generating, from the steady-state analysis filters, an analysis matrix representing the analysis filter bank, multiplying the analysis matrix by a permutation matrix to generate a permutated analysis matrix, truncating the permutated analysis matrix to a degree to generate a rectangular truncated analysis matrix, and selecting a number of left boundary filters and a number of right boundary filters such that, when the row vectors corresponding to the number of left boundary filters and the number of right boundary filters are added to the truncated analysis matrix, the truncated analysis matrix becomes square. Each row vector added to the truncated analysis matrix lies outside a row space of the truncated analysis matrix such that the row vector specifies a permissible design for a boundary filter. The biorthogonal filter bank also includes a synthesis filter bank corresponding to the analysis filter bank. The synthesis filter bank includes a number of left boundary filters, a number of right boundary filters, and a number of steady-state synthesis filters. A synthesis matrix specifies the left boundary filters, right boundary filters, and steady-state synthesis filters of the synthesis filter bank. The synthesis matrix has been created by calculating the dual, or inverse, of the square analysis matrix.

Particular embodiments of the present invention may provide one or more technical advantages. Particular embodiments may facilitate selection of appropriate boundary filters for an analysis portion of a filter bank. In particular embodiments, boundary filters may be chosen to satisfy a number of criteria, such as frequency selectivity or number of vanishing moments, and need only be linearly independent of the filters of the original filter bank. In particular embodiments, a synthesis filter bank is found by calculating the dual of an analysis filter bank, resulting in a biorthogonal, perfect reconstruction filter bank. In particular embodiments, an analysis filter bank is found that is sub-band length-preservative. In particular embodiments, a synthesis filter bank preserves the length of the output (which is equal to that of the input). Certain embodiments may provide all, some, or none of these technical advantages, and certain embodiments may provide one or more other technical advantages which may be readily apparent to those skilled in the art from the figures, descriptions, and claims included herein.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
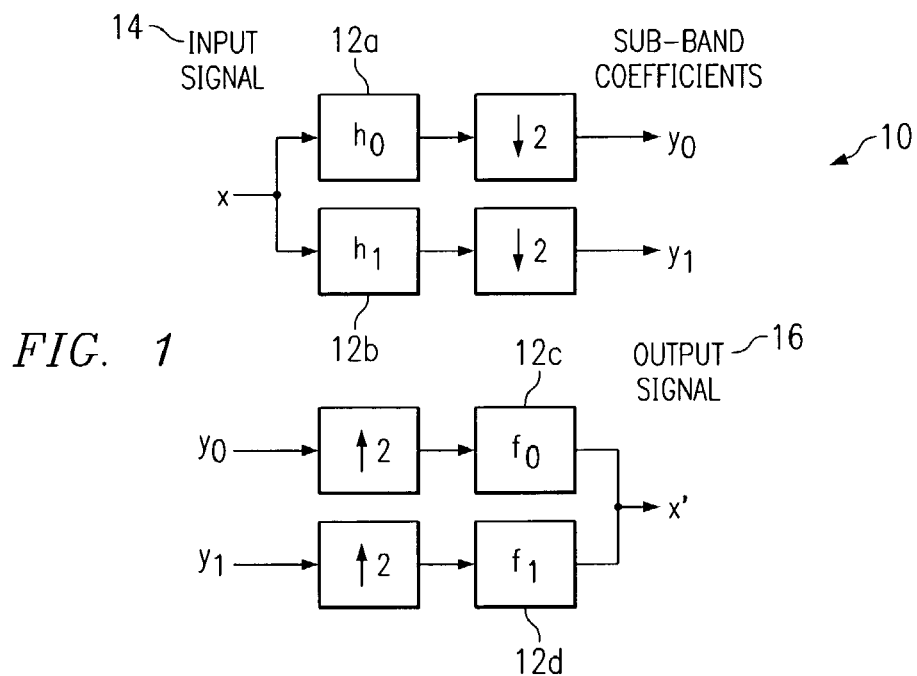
FIG. 1 illustrates an example two-channel filter bank.

FIG. 1 illustrates an example two-channel filter bank 10. Filter banks can be interpreted from a linear algebra perspective, which may provide a powerful and notationally compact representation of filter banks. Although an example two-channel filter bank is described for the sake of simplicity, the present invention contemplates a filter bank including any suitable number of channels. Analysis filter bank 10 may include filters 12. Filter 12a may be designated as filter $h_0$, filter 12b may be designated as filter $h_1$, filter 12c may be designated as filter $f_0$, and filter 12b may be designated as filter $f_1$. Filters $h_0$ and $h_1$ are analysis (i.e. decomposition) filters and may, respectively, be a low-pass filter and a high-pass filter. Collectively, analysis filters $h_0$ and $h_1$ form an analysis filter bank. Filters $f_0$ and $f_1$ are synthesis (i.e. reconstruction) filters. Collectively, filters $f_0$ and $f_1$ form a synthesis filter bank. In a perfect reconstruction (PR) filter bank 10, an input vector x representing an input signal 14 will equal an output vector x' representing an output signal 16. Output vector x' may, in particular embodiments, be a delayed version of input vector x due to the inherent delay of filter banks. However, this delay may be ignored without any loss of generality.

For an input vector x that is infinite in length and for finite impulse response (FIR) analysis and synthesis filters $h_0$, $h_1$, and $f_0$, $f_1$, respectively, the analysis and synthesis portions of the filter bank can be expressed as infinite-banded block Toeplitz matrices. Filter bank 10 can be expressed as a linear transformation of input vector x:

$$Hx = \begin{bmatrix} y_0 \\ y_1 \end{bmatrix} \quad (1)$$

$$F\begin{bmatrix} y_0 \\ y_1 \end{bmatrix} = x' \quad (2)$$

In Equation (1), H is the matrix representation of the analysis filter bank, and F is the matrix representation of the synthesis filter bank. The analysis matrix H can be pre-multiplied by a permutation matrix P to achieve an interleaving of the low-pass and high-pass sub-band coefficients (F must then be multiplied by the transpose of the permutation matrix $P^T$).

The following matrices illustrate the structure of the analysis and synthesis filter bank matrices H and F, respectively, after a permutation matrix P has been applied:

$$H = \begin{bmatrix} \ddots & \vdots & \vdots & \vdots & \vdots & \vdots & \vdots & \vdots \\ \cdots & h_o(N_a-1) & h_o(N_a-2) & h_o(N_a-3) & \cdots & h_o(1) & h_o(0) & 0 & \cdots \\ \cdots & h_1(N_a-1) & h_1(N_a-2) & h_1(N_a-3) & \cdots & h_o(1) & h_o(1) & 0 & \cdots \\ \cdots & 0 & 0 & h_o(N_a-1) & \cdots & h_o(3) & h_o(2) & h_o(1) & \cdots \\ \cdots & 0 & 0 & h_1(N_a-1) & \cdots & h_1(3) & h_1(2) & h_1(1) & \cdots \\ & \vdots & \ddots & \ddots & \ddots & \ddots & \ddots & \ddots \end{bmatrix}$$

$$F = \begin{bmatrix} \ddots & \vdots & \vdots & \vdots & \vdots & \vdots \\ \cdots & f_0(0) & f_1(0) & 0 & 0 & \cdots \\ \cdots & f_0(1) & f_1(1) & 0 & 0 & \cdots \\ \cdots & f_0(2) & f_1(2) & f_0(0) & f_1(0) & \cdots \\ \cdots & \vdots & \vdots & \vdots & \vdots & \cdots \\ \cdots & f_0(N_s-2) & f_1(N_s-2) & f_0(N_s-4) & f_1(N_s-4) & \cdots \\ \cdots & f_0(N_s-1) & f_1(N_s-1) & f_0(N_s-3) & f_1(N_s-3) & \cdots \\ \cdots & 0 & 0 & f_0(N_s-2) & f_1(N_s-2) & \cdots \\ & \vdots & \vdots & \vdots & \vdots & \ddots \end{bmatrix}$$

The analysis matrix H illustrates the structure of an infinite analysis filter bank matrix. The length of filters $h_0$ and $h_1$ is $N_a$. The analysis matrix H contains time-reversed analysis filters with double-shifted rows from the decimation operator. The synthesis matrix F illustrates the structure of an infinite synthesis filter bank matrix. The length of the synthesis filters is $N_s$. The columns are double-shifted from the interpolation operator.

In a PR filter bank 10, $$FH = I. \quad (3)$$

F is the dual of H, and filter bank 10 may be considered biorthogonal. In addition, if $F = H^T$, filter bank 10 is an orthogonal filter bank 10. Combining the results of Equations (1), (2), and (3), above, $$FHx = x. \quad (4)$$

Thus, the filter bank operation can be thought of as a projection of the input vector x onto the column space of the synthesis matrix F.

When the input vector x is finite in length, the description above may be modified. Signal extension techniques may include zero padding, periodic extension, and symmetric extension. These techniques may be computationally simple, but generally introduce unnatural jumps in the signal, and at times can create awkward representations of the original signal, depending on the application. These techniques also generally result in redundant sub-band information. Boundary filter designs may be preferable over signal extension techniques because boundary filter designs can provide sub-band length preservation and may be designed to closely match the steady-state behavior of filter bank 10. Traditional boundary filter design techniques involve truncating the infinite analysis and synthesis matrices H and F, respectively, and then adding rows and columns to make the matrices square and invertable. Further manipulation allows the boundary filters to satisfy certain requirements, such as frequency selectivity or coding gain. However, for certain types of filters (such as minimum phase filters), these techniques may achieve Equation (4), above, but may be unable to achieve other criteria (such as, for example, frequency selectivity).

Particular embodiments of the present invention may facilitate the design of boundary filters for the analysis filter bank to satisfy a number of different requirements regardless of the prototype filters used for filter bank 10. Such requirements may include, but are not limited to, frequency selectivity and the number of vanishing moments of the boundary filters. In particular embodiments, the synthesis filter bank may be found by calculating the dual of the analysis filter bank.

A property of biorthogonal filter banks 10 is that the analysis and synthesis matrices H and F, respectively, need not be orthogonal. For a biorthogonal filter bank 10, the rows of H need only be linearly independent of each other. The same may be said about the columns of F. For a finite length input vector x, the analysis and synthesis matrices H and F, respectively, also become finite. Furthermore, matrices H and F are square, such that lengths of the sub-band coefficients may be preserved.

Simply truncating the infinite matrices H and F to square matrices may not provide perfect reconstruction. Equation (3), above, may no longer hold. However, it may be desirable for the "middle," or steady-state, portion of the square matrices to have a structure and behavior similar to its infinite counterpart. Therefore, to begin the boundary filter design process, a rectangular truncation of the analysis matrix H is performed. The truncated matrix may be referred to as $H_t$. The size of $H_t$ may depend on the length of the input vector x, the number of channels in the analysis filter bank, and the length of the analysis filters $h_0$, $h_1$. For the sake of simplicity, two-channel analysis and synthesis filter banks are described and it is assumed that the input vector length is of the form $L=2p+N_a$. L is the length of the input vector x, p is a positive integer value, and $N_a$ is the length of the analysis filters $h_0$, $h_1$. The size of $H_t$ is 2(p+1) by L. For most applications it may be assumed that L>>2(p+1). The resulting structure is shown in the following matrix. To make the matrix square, $N_a-2$ rows are added.

or (6), above, is satisfied for a particular $b^T$, that row is kept, and the truncated matrix may be updated to include the new row. Equations (5) and (6) are repeated for each additional row that is added until $H_t$ becomes square.

To simplify the computation, the same boundary filters for the left side can be used on the right side, provided the non-zero values of the filters do not overlap. This can be seen by an example. Let L=6, and the first left boundary filter $b_{l1}$=[1 1 0 0 0 0] be a Haar low-pass filter. The right boundary filter can be chosen to be $b_{r1}$=[0 0 0 0 1 1]. This filter is independent of the left boundary filters and, if it also satisfies Equation (6), above, it is a valid candidate. In most practical applications Equations (5) and (6) can be satisfied. The boundary filters can be designed using various FIR design methods or by choosing established filters that $$H_t = \begin{bmatrix} h_0(N_a-1) & h_0(N_a-2) & h_0(N_a-3) & \cdots & h_0(0) & 0 & 0 & 0 & \cdots & 0 \\ h_1(N_a-1) & h_1(N_a-1) & h_1(N_a-3) & \cdots & h_1(0) & 0 & 0 & 0 & \cdots & 0 \\ 0 & 0 & h_0(N_a-1) & \cdots & h_0(2) & h_0(1) & h_0(0) & 0 & \cdots & \vdots \\ \vdots & \vdots & h_1(N_a-1) & \cdots & h_1(2) & h_1(1) & h_1(0) & 0 & \cdots & \vdots \\ \ddots & \ddots & \ddots & \ddots & \ddots & \ddots & \ddots & \ddots & \ddots & \vdots \\ \ddots & \ddots & \ddots & \ddots & \ddots & \ddots & \ddots & \ddots & \ddots & \vdots \\ 0 & 0 & \cdots & \cdots & \cdots & \cdots & \cdots & \cdots & h_0(1) & h_1(1) \\ 0 & 0 & \cdots & \cdots & \cdots & \cdots & \cdots & \cdots & h_1(1) & h_0(0) \end{bmatrix}$$

In the orthogonal case, the boundary filters can be found using a Gram-Schmidt based technique. However, this technique may not provide features beyond orthogonality for the boundary filters. As described above, for a biorthogonal filter bank 10, only linear independence of the rows is necessary.

For the left boundary, $b_l$, boundary filters may be needed. For the right, $b_r$, filters may be needed, with $b_l+b_r=N_a-2$. The number of left and right filters can be chosen arbitrarily, but the structure of the problem suggests that they be balanced. There may be no constraints on the length of the filters (except that they be less than or equal to L) but, as their purpose is to analyze the boundaries of the input signal 14 (beginning and end), their support should reflect this. Therefore, the support of the boundary filters should be equal to or less than the support of the analysis filters $h_0$, $h_1$.

Beyond these requirements, there are no further restrictions on the design of the boundary filters. Therefore, for the left boundary case, any row vector $b^T$ with support less than or equal to $N_a$ is suitable, provided the following is true:

$$\operatorname{rank}\left(\begin{bmatrix} b^T & 0 \\ H_t & \end{bmatrix}\right) = \operatorname{rank}(H_t) + 1 \quad (5)$$

For the right boundary case, Equation (5) becomes the following:

$$\operatorname{rank}\left(\begin{bmatrix} H_t \\ 0 & b^T \end{bmatrix}\right) = \operatorname{rank}(H_t) + 1 \quad (6)$$

Stated another way, the vector [$b^T$0] (or [0 $b^T$]) must not lie in the row space of H to be considered a candidate (this would violate Equations (5) and (6), above). If Equation (5)

exhibit desired behavior (which may include frequency selectivity, number of vanishing moments, and so on). The dual of the now square analysis matrix H may be determined next.

The dual of any square invertable matrix is its inverse. According to Equations (5) and (6), the analysis matrix H has full rank and is therefore invertable. If $H_s$ is the newly created square analysis matrix, the synthesis matrix $F_s$ can be expressed as $$F_s = H_s^{-1}. \quad (7)$$

Although conceptually simple, calculating the inverse of a large matrix can be difficult. However, the bulk of the computation can be avoided due to the structure of $H_s$. The steady-state portion of the finite synthesis matrix $F_s$ is identical to its infinite counterpart F, which is a result of the design of the analysis matrix $H_s$. The middle of $F_s$ is a truncated version of the infinite matrix F. Furthermore, due to the sparse structure of $H_s$ and with proper partitioning of $H_s$, the boundaries of the synthesis matrix $F_s$ can be found with less computational complexity. One side effect of the inverse operation is that the synthesis matrix $F_s$ may have more boundary filters than the analysis matrix $H_s$. The number of synthesis boundary filters is directly proportional to the number of analysis boundary filters used and their support.

$F_s$ may be calculated as follows. First, the truncated version of F may be constructed in the same way that $H_t$ was created from the analysis filters $h_0$, $h_1$. The truncated synthesis matrix $F_t$ has dimensions L by 2(p+1). $H_s$ may then be partitioned into a block matrix having three rows and three columns with the following form:

$$H_s = \begin{bmatrix} B_l & A_{um} & 0 \\ A_{ml} & H_c & A_{mr} \\ 0 & A_{bm} & B_r \end{bmatrix} \quad (8)$$

The size of $B_l$ and $B_r$ depends on the number of boundary filters used and the length of the filters. If $N_b$ is the length of the boundary filter with the longest support, the size of $B_l$ and $B_r$ should be $(N_b+\max(b_l,b_r))$ by $(N_b+\max(b_l,b_r))$, where $b_l$ and $b_r$ are the number of left and right boundary filters, respectively. The zero matrices at the corners are also of size $(N_b+\max(b_l,b_r))$ by $(N_b+\max(b_l,b_r))$. The sizes of $A_{um}$ and $A_{lm}$ are $(N_b+\max(b_l,b_r))$ by $(L-2(N_b+\max(b_l,b_r)))$. The sizes of $A_{ml}$ and $A_{mr}$ are $(L-2(N_b+\max(b_l,b_r)))$ by $(N_b+\max(b_l,b_r))$. Finally, the size of $H_c$ is $(L-2(N_b+\max(b_l,b_r)))$ by $(L-2(N_b+\max(b_l,b_r)))$. Due to the relative sparsity of the matrix, $A_{ml}$, $A_{mr}$, $A_{um}$, and $A_{lm}$ have few non-zero values at their corners.

The inverse of the left and right boundaries of the synthesis matrix $F_s$ may be calculated. The left and right boundaries have size $(N_b+\max(b_l,b_r))$ by $(N_b+\max(b_l,b_r))$ and may be calculated as follows. These results are derived from the inverse of a block matrix having three columns and three rows with the additional sparsity constraint that exists in particular embodiments.

$$F_l = B_l^{-1}(I - A_{um}(A_{ml}B_l^{-1}A_{um} - H_c)^{-1}A_{ml}B_l^{-1}) \quad (9)$$

$$F_r = (B_r - A_{lm}(H_c - A_{lm}B_l^{-1}A_{um})^{-1}A_{mr})^{-1} \quad (10)$$

It may, in particular embodiments, be easier to calculate these matrices than to invert the analysis matrix $H_s$.

The columns of $F_l$ and $F_r$ may be inserted into the appropriate location in $F_s$. The number of left and right boundary filters in $F_s$ is greater than in the analysis matrix $H_s$, which may be due to the inverse operation. The final version of the synthesis matrix $F_s$, can be constructed by adding $b_l$ columns of zeros to the left of $F_s$, and $b_r$ columns of zeros to the right of $F_s$. The upper and lower $(N_b+\max(b_l,b_r))$ by $(N_b+\max(b_l,b_r))$ portions of the new $F_s$ are then replaced by $F_l$ and $F_r$ respectively.

Figure 2:
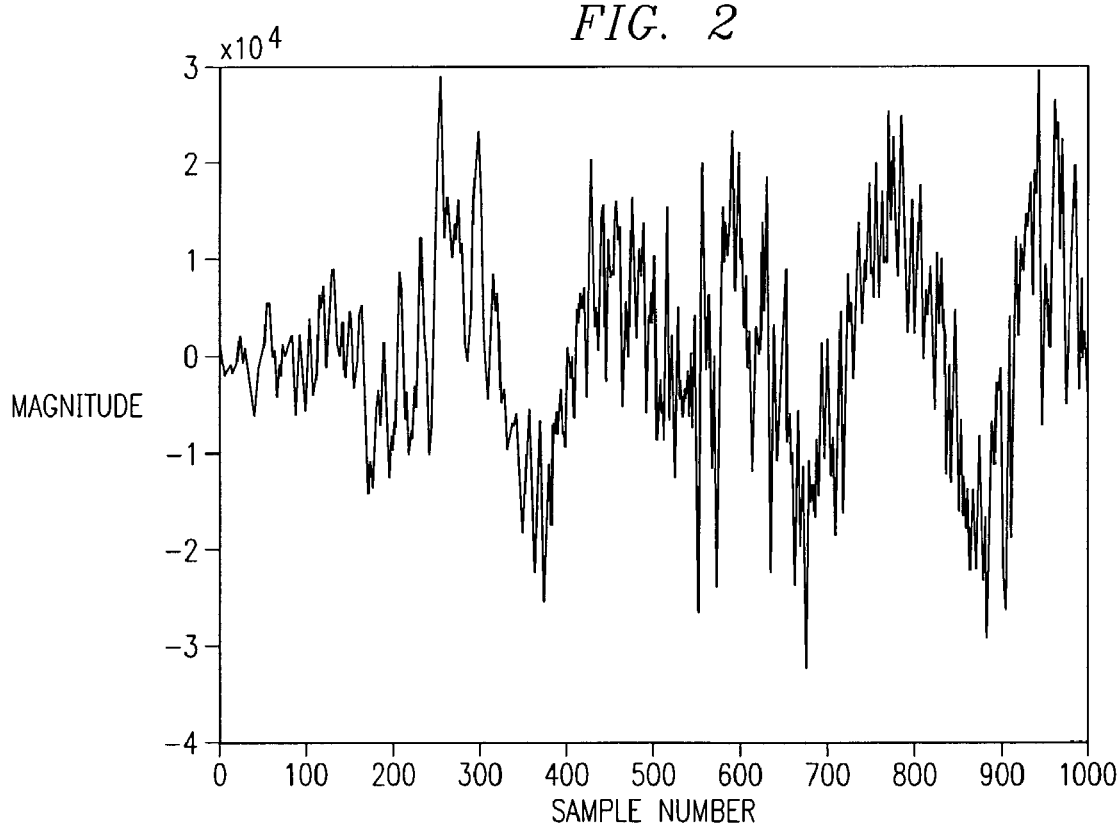
FIG. 2 illustrates example samples of a piano note.

One possible application in which finite length input signals 14 may be used is segmentation-based audio coding. Using boundary filters, an audio signal can be divided into short frames without substantial overlap or windowing. Consider a two-channel filter bank 10 that uses Daubechies 8-tap (db4) analysis filters $h_0$, $h_1$. The db4 analysis filters $h_0$, $h_1$ can be used to create an orthogonal filter bank 10 for the infinite input case. The db4 analysis filters $h_0$, $h_1$ also have four vanishing moments. For this example, the first one thousand samples of the attack transient portion of a piano note may be analyzed, as illustrated in FIG. 2. The finite analysis filter bank matrix H requires six boundary filters. For this application, it is preferable for the boundary filters to be substantially identical to the db4 analysis filters $h_0$, $h_1$ in terms of frequency selectivity and number of vanishing moments. Therefore, two sets of high-pass and low-pass filters with the necessary properties are needed as boundary filters (the same filters may be used for the left and right boundaries, as described above).

Figure 3:
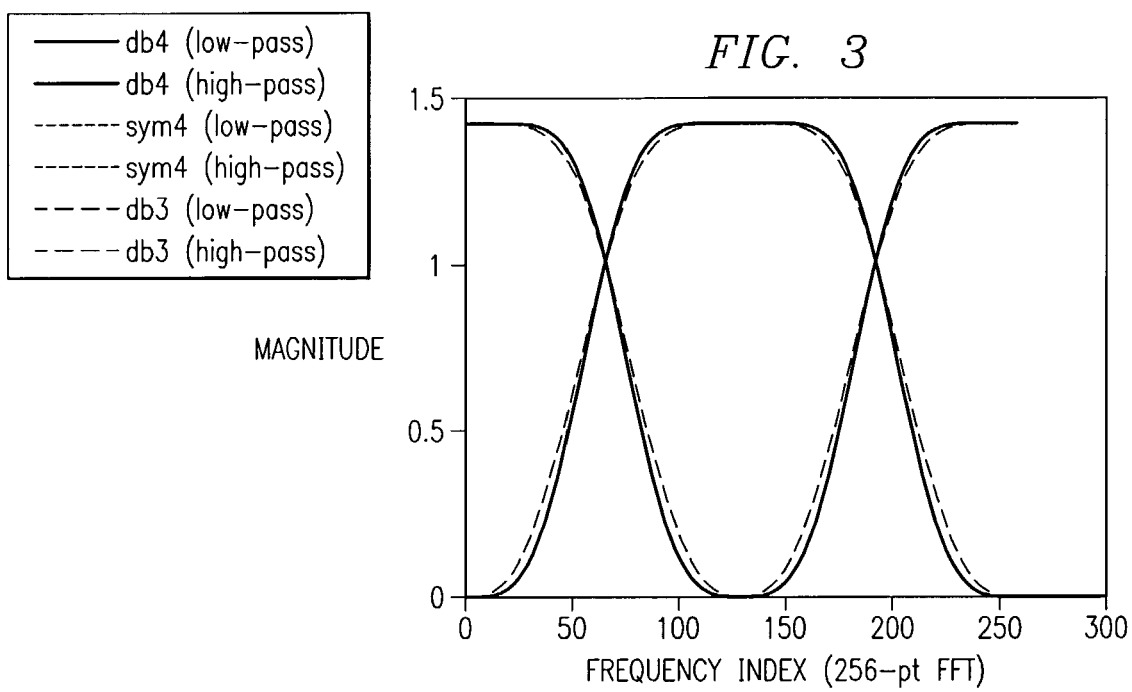
FIG. 3 illustrates an example magnitude response of example boundary filters and example analysis filters.
Figure 4A:
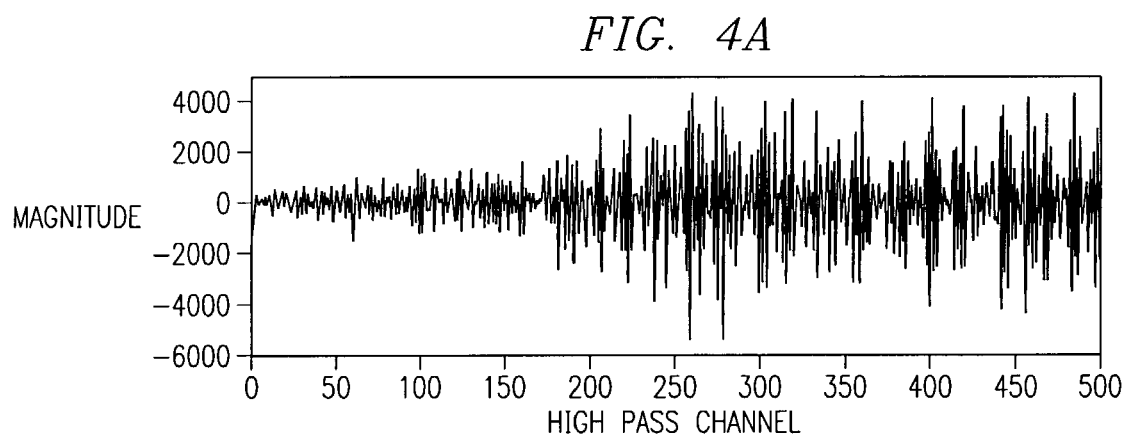
FIG. 4 illustrates example sub-band coefficients.
Figure 4B:
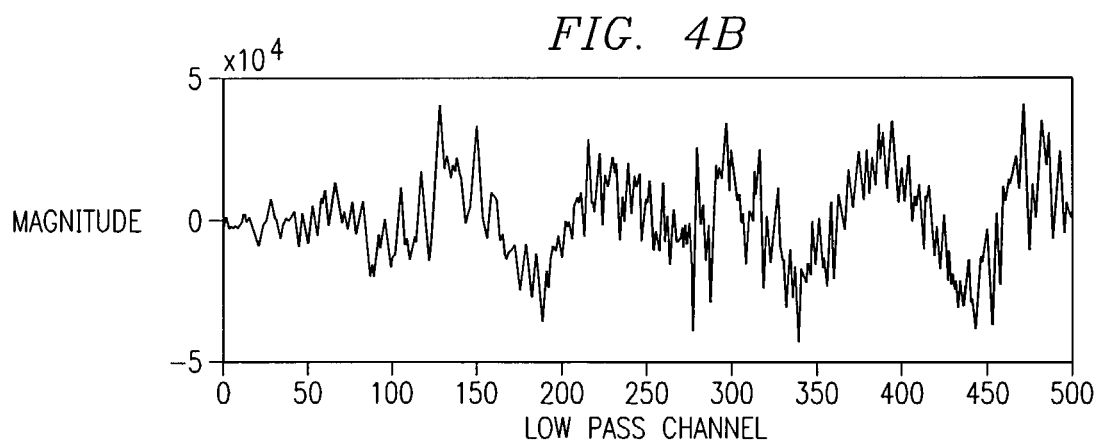

The db4 analysis filters $h_0$, $h_1$ come from wavelet analysis. The boundary filters may also be chosen from wavelet analysis because of their similar properties. Therefore, one set of high-pass and low-pass filters can be chosen to be the Symlet 8-tap analysis filters (Sym4). The Sym 4 analysis filter also has four vanishing moments and frequency selectivity substantially identical to the db4 analysis filters. For the second set, db3 analysis filters can be used which have three vanishing moments and very similar frequency selectivity. FIG. 3 illustrates the magnitude response of the boundary filters and the main analysis filters $h_0$, $h_1$. FIG. 4 illustrates the sub-band coefficients after analysis is performed. The coefficients are substantially smooth at the boundaries (no large jumps), and the total length of the sub-band coefficients is equal to the original signal length. The signal can be reconstructed by calculating the inverse of the analysis matrix H. The resultant filter bank 10 is biorthogonal, even though the initial analysis filters $h_0$, $h_1$ are orthogonal.

Design methods for boundary filters are described herein. For any appropriate choice of analysis filters $h_0$, $h_1$, corresponding boundary filters can be designed to satisfy any suitable criteria (which may include frequency selectivity and number of vanishing moments), so long as they also satisfy Equations (5) and (6). The synthesis filter bank is calculated by finding the dual of the analysis filter bank. The resulting filter bank 10 forms a biorthogonal filter bank 10. An advantage of particular embodiments lies in the control over the analysis filter bank. Particular embodiments can be used in reverse, with the analysis filter bank resulting from the dual of the synthesis filter bank. In this case, the boundary filters are added to the synthesis matrix as columns. The column vectors now must lie outside the column space of the synthesis matrix. Equations (5) and (6) should be modified to represent this subtle change. Although particular filter banks 10 that include a particular number of channels and have input vectors x of particular lengths are described, the present invention contemplates filter banks 10 that include any suitable number of channels and have input vectors x of any suitable (even arbitrary) length. In addition, particular embodiments may be used in connection with time-varying filter banks 10.

Figure 5:
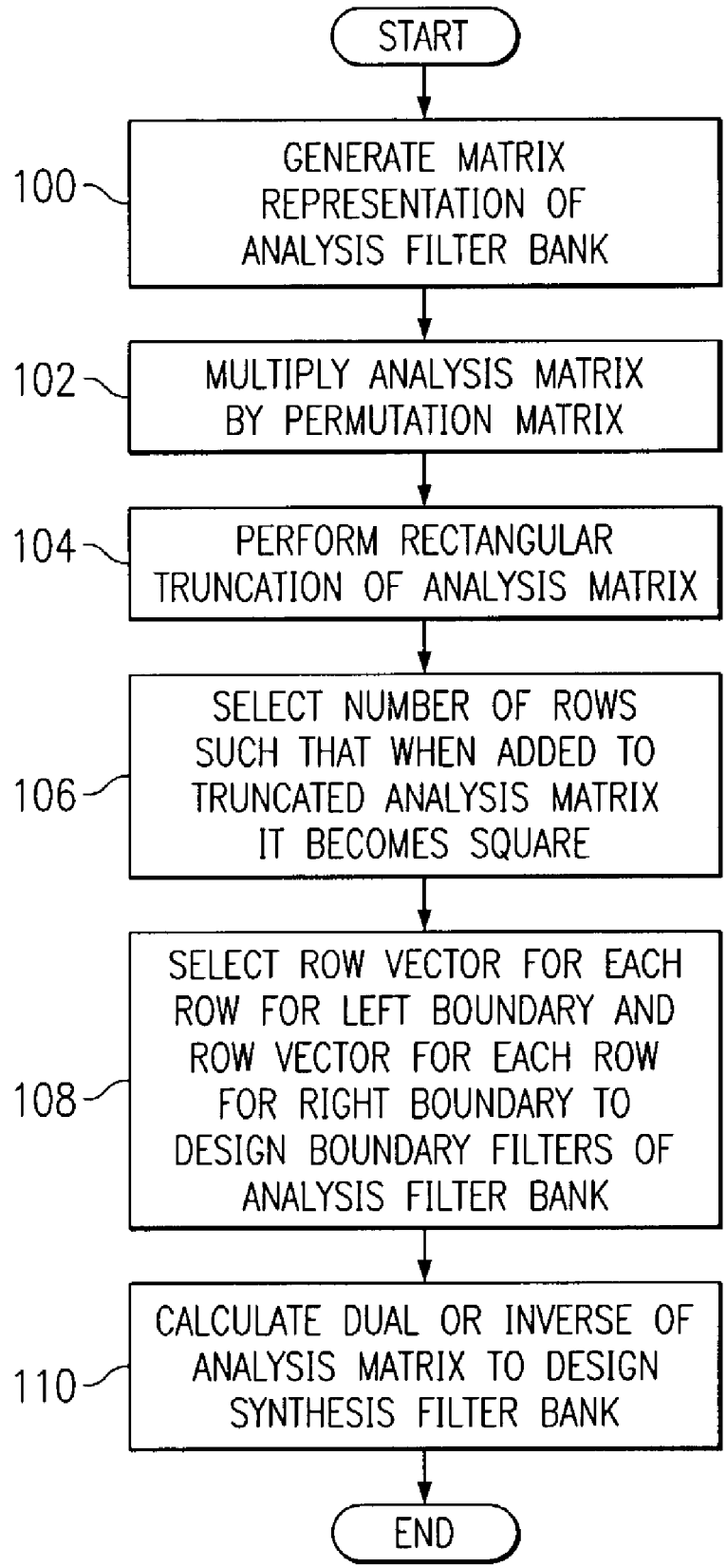
FIG. 5 illustrates an example method for designing boundary filters for a biorthogonal filter bank.

FIG. 5 illustrates an example method for designing boundary filters for a biorthogonal filter bank 10. The method begins at step 100, where a matrix representation H of the analysis filter bank is generated. At step 102, the analysis matrix H is multiplied by a permutation matrix P. At step 104, rectangular truncation of the analysis matrix H is performed. The degree of truncation depends on the length of the input vector x, the number of channels in the analysis filter bank, and the length of the analysis filters $h_0$, $h_1$. At step 106, the number of rows are selected such that when added to the truncated analysis matrix it becomes square. At step 108, a row vector for each row for the left boundary and a row vector for each row for the right boundary are selected to design the boundary filters of the analysis filter bank. A row vector is only selected if it satisfies Equations (5) and (6), above. A row vector satisfying Equations (5) and (6) specifies a valid design for a boundary filter. In particular embodiments, the same boundary filters may be used for the right boundary as for the left boundary, so long as the right boundary filters satisfy Equations (5) and (6). At step 110, the dual or inverse of the analysis matrix H is calculated to design a corresponding synthesis filter bank, at which point the method ends. Particular embodiments can be used in reverse, with the analysis filter bank resulting from the dual of the synthesis filter bank, with appropriate modifications of Equations (5) and (6) and step 108, as described above. In particular embodiments, all or some of these steps may be performed by one or more computer systems using software, hardware, or other logic. In particular embodiments, all or some of these steps may be performed manually.

Although the present invention has been described with several embodiments, sundry changes, substitutions, variations, alterations, and modifications may be suggested to one skilled in the art, and it is intended that the invention may encompass all such changes, substitutions, variations, alterations, and modifications falling within the spirit and scope of the appended claims.

What is claimed is:

1. A signal processing device comprising a biorthogonal filter bank operable to process a finite length signal that comprises a left boundary and a right boundary, the biorthogonal filter bank comprising:
an analysis filter bank comprising one or more left boundary filters, one or more right boundary filters, and one or more steady-state analysis filters, each left boundary filter and each right boundary filter comprising a row vector, the left and right boundary filters having been designed by:
generating, from the steady-state analysis filters, an analysis matrix representing the analysis filter bank;
multiplying the analysis matrix by a permutation matrix to generate a permutated analysis matrix;
truncating the permutated analysis matrix to a degree to generate a rectangular truncated analysis matrix; and
selecting a number of left boundary filters and a number of right boundary filters such that, when the row vectors corresponding to the number of left boundary filters and the number of right boundary filters are added to the truncated analysis matrix, the truncated analysis matrix becomes square, each row vector added to the truncated analysis matrix lying outside a row space of the truncated analysis matrix such that the row vector specifies a permissible design for a boundary filter; and
a synthesis filter bank corresponding to the analysis filter bank, the synthesis filter bank comprising a number of left boundary filters, a number of right boundary filters, and a number of steady-state synthesis filters, a synthesis matrix specifying the left boundary filters, right boundary filters, and steady-state synthesis filters of the synthesis filter bank, the synthesis matrix having been created by calculating the dual, or inverse, of the square analysis matrix.

2. The signal processing device of claim 1, wherein the degree of truncation of the permutated analysis matrix depends, at least in part, on one or more of a length of an input vector, a number of channels in the biorthogonal filter bank, and a length of two or more original analysis filters.

3. The signal processing device of claim 1, wherein the design of a left boundary filter is used as the design of a right boundary filter.

4. The signal processing device of claim 1, wherein the analysis filter bank provides sub-band length preservation.

5. The signal processing device of claim 1, wherein the boundary filters substantially match the steady-state behavior of an infinite biorthogonal filter bank.

6. The signal processing device of claim 1, wherein the boundary filters meet one or more criteria, the criteria comprising one or more of criteria associated with frequency selectivity, criteria associated with coding gain, and criteria associated with a number of vanishing moments.

7. The signal processing device of claim 1, wherein the biorthogonal filter bank is used for segmentation-based audio coding, the finite length signal being a finite segment of an infinite length signal.

8. The signal processing device of claim 1, wherein the biorthogonal filter bank is used for segmentation-based audio coding, the finite length signal being a segment of a longer finite length signal.

9. A method for processing signal, the method comprising:
receiving a finite length signal comprising a left boundary and a right boundary;
processing the signal using a signal processing device comprising a biorthogonal filter bank that comprises:
an analysis filter bank comprising one or more left boundary filters, one or more right boundary filters, and one or more steady-state analysis filters, each left boundary filter and each right boundary filter comprising a row vector, the left and right boundary filters having been designed by:
generating, from the steady-state analysis filters, an analysis matrix representing the analysis filter bank;
multiplying the analysis matrix by a permutation matrix to generate a permutated analysis matrix;
truncating the permutated analysis matrix to a degree to generate a rectangular truncated analysis matrix; and
selecting a number of left boundary filters and a number of right boundary filters such that, when the row vectors corresponding to the number of left boundary filters and the number of right boundary filters are added to the truncated analysis matrix, the truncated analysis matrix becomes square, each row vector added to the truncated analysis matrix lying outside a row space of the truncated analysis matrix such that the row vector specifies a permissible design for a boundary filter; and
a synthesis filter bank corresponding to the analysis filter bank, the synthesis filter bank comprising a number of left boundary filters, a number of right boundary filters, and a number of steady-state synthesis filters, a synthesis matrix specifying the left boundary filters, right boundary filters, and steady-state synthesis filters of the synthesis filter bank, the synthesis matrix having been created by calculating the dual, or inverse, of the square analysis matrix.

10. The method of claim 9, wherein the degree of truncation of the permutated analysis matrix depends, at least in part, on one or more of a length of an input vector, a number of channels in the biorthogonal filter bank, and a length of two or more original analysis filters.

11. The method of claim 9, wherein the design of a left boundary filter is used as the design of a right boundary filter.

12. The method of claim 9, wherein the analysis filter bank provides sub-band length preservation.

13. The method of claim 9, wherein the boundary filters substantially match the steady-state behavior of an infinite biorthogonal filter bank.

14. The method of claim 9, wherein the boundary filters meet one or more criteria, the criteria comprising one or more of criteria associated with frequency selectivity, criteria associated with coding gain, and criteria associated with a number of vanishing moments.

15. The method of claim 9, wherein the biorthogonal filter bank is used for segmentation-based audio coding, the finite length signal being a finite segment of an infinite length signal.

16. The method of claim 9, wherein the biorthogonal filter bank is used for segmentation-based audio coding, the finite length signal being a segment of a longer finite length signal.

17. A method for designing boundary filters of a biorthogonal filter bank operable to process a finite length signal that comprises a left boundary and a right boundary, the biorthogonal filter bank comprising an analysis filter bank and a synthesis filter bank, the analysis filter bank comprising one or more left boundary filters, one or more right boundary filters, and one or more steady-state analysis filters, the synthesis filter bank comprising one or more left boundary filters, one or more right boundary filters, and one or more steady-state synthesis filters, the method comprising:

generating, from the steady-state analysis filters, an analysis matrix representing the analysis filter bank;

multiplying the analysis matrix by a permutation matrix to generate a permutated analysis matrix;

truncating the permutated analysis matrix to a degree to generate a rectangular truncated analysis matrix;

selecting a number of left boundary filters and a number of right boundary filters such that, when row vectors corresponding to the number of left boundary filters and the number of right boundary filters are added to the truncated analysis matrix, the truncated analysis matrix becomes square, each row vector added to the truncated analysis matrix lying outside a row space of the truncated analysis matrix such that the row vector specifies a permissible design for a boundary filter; and calculating the dual, or inverse, of the square analysis matrix to generate a synthesis matrix specifying the left boundary filters, right boundary filters, and steady-state synthesis filters of the synthesis filter bank.

18. The method of claim 17, wherein the degree of truncation of the permutated analysis matrix depends, at least in part, on one or more of a length of an input vector, a number of channels in the biorthogonal filter bank, and a length of two or more original analysis filters.

19. The method of claim 17, wherein the design of a left boundary filter is used as the design of a right boundary filter.

20. The method of claim 17, wherein the analysis filter bank provides sub-band length preservation.

21. The method of claim 17, wherein the boundary filters substantially match the steady-state behavior of an infinite biorthogonal filter bank.

22. The method of claim 17, wherein the boundary filters meet one or more criteria, the criteria comprising one or more of criteria associated with frequency selectivity, criteria associated with coding gain, and criteria associated with a number of vanishing moments.

23. The method of claim 17, wherein the biorthogonal filter bank is used for segmentation-based audio coding, the finite length signal being a finite segment of an infinite length signal.

24. The method of claim 17, wherein the biorthogonal filter bank is used for segmentation-based audio coding, the finite length signal being a segment of a longer finite length signal.

25. A signal processing device comprising a biorthogonal filter bank operable to process a finite length signal that comprises a left boundary and a right boundary, the biorthogonal filter bank comprising:

a synthesis filter bank comprising one or more left boundary filters, one or more right boundary filters, and one or more steady-state synthesis filters, each left boundary filter and each right boundary filter comprising a column vector, the left and right boundary filters having been designed by:

generating, from the steady-state synthesis filters, a synthesis matrix representing the synthesis filter bank;

multiplying the synthesis matrix by a permutation matrix to generate a permutated synthesis matrix;

truncating the permutated synthesis matrix to a degree to generate a rectangular truncated synthesis matrix; and selecting a number of left boundary filters and a number of right boundary filters such that, when the column vectors corresponding to the number of left boundary filters and the number of right boundary filters are added to the truncated synthesis matrix, the truncated synthesis matrix becomes square, each column vector added to the truncated synthesis matrix lying outside a column space of the truncated synthesis matrix such that the column vector specifies a permissible design for a boundary filter; and an analysis filter bank corresponding to the synthesis filter bank, the analysis filter bank comprising a number of left boundary filters, a number of right boundary filters, and a number of steady-state analysis filters, an analysis matrix specifying the left boundary filters, right boundary filters, and steady-state analysis filters of the analysis filter bank, the analysis matrix having been created by calculating the dual, or inverse, of the square synthesis matrix.

26. The signal processing device of claim 25, wherein the degree of truncation of the permutated synthesis matrix depends, at least in part, on one or more of a length of an input vector, a number of channels in the biorthogonal filter bank, and a length of two or more original synthesis filters.

27. The signal processing device of claim 25, wherein the design of a left boundary filter is used as the design of a right boundary filter.

28. The signal processing device of claim 25, wherein the analysis filter bank provides sub-band length preservation.

29. The signal processing device of claim 25, wherein the boundary filters substantially match the steady-state behavior of an infinite biorthogonal filter bank.

30. The signal processing device of claim 25, wherein the boundary filters meet one or more criteria, the criteria comprising one or more of criteria associated with frequency selectivity, criteria associated with coding gain, and criteria associated with a number of vanishing moments.

31. The signal processing device of claim 25, wherein the biorthogonal filter bank is used for segmentation-based audio coding, the finite length signal being a finite segment of an infinite length signal.

32. The signal processing device of claim 25, wherein the biorthogonal filter bank is used for segmentation-based audio coding, the finite length signal being a segment of a longer finite length signal.

33. A method for processing signal, the method comprising:

receiving a finite length signal comprising a left boundary and a right boundary;

processing the signal using a signal processing device comprising a biorthogonal filter bank that comprises:

a synthesis filter bank comprising one or more left boundary filters, one or more right boundary filters, and one or more steady-state synthesis filters, each left boundary filter and each right boundary filter comprising a column vector, the left and right boundary filters having been designed by:

generating, from the steady-state synthesis filters, a synthesis matrix representing the analysis filter bank;

multiplying the synthesis matrix by a permutation matrix to generate a permutated synthesis matrix;

truncating the permutated synthesis matrix to a degree to generate a rectangular truncated synthesis matrix; and selecting a number of left boundary filters and a number of right boundary filters such that, when the column vectors corresponding to the number of left boundary filters and the number of right boundary filters are added to the truncated synthesis matrix, the truncated synthesis matrix becomes square, each column vector added to the truncated synthesis matrix lying outside a column space of the truncated synthesis matrix such that the column vector specifies a permissible design for a boundary filter; and an analysis filter bank corresponding to the synthesis filter bank, the analysis filter bank comprising a number of left boundary filters, a number of right boundary filters, and a number of steady-state analysis filters, an analysis matrix specifying the left boundary filters, right boundary filters, and steady-state analysis filters of the analysis filter bank, the analysis matrix having been created by calculating the dual, or inverse, of the square synthesis matrix.

34. The method of claim 33, wherein the degree of truncation of the permutated synthesis matrix depends, at least in part, on one or more of a length of an input vector, a number of channels in the biorthogonal filter bank, and a length of two or more original analysis filters.

35. The method of claim 33, wherein the design of a left boundary filter is used as the design of a right boundary filter.

36. The method of claim 33, wherein the analysis filter bank provides sub-band length preservation.

37. The method of claim 33, wherein the boundary filters substantially match the steady-state behavior of an infinite biorthogonal filter bank.

38. The method of claim 33, wherein the boundary filters meet one or more criteria, the criteria comprising one or more of criteria associated with frequency selectivity, criteria associated with coding gain, and criteria associated with a number of vanishing moments.

39. The method of claim 33, wherein the biorthogonal filter bank is used for segmentation-based audio coding, the finite length signal being a finite segment of an infinite length signal.

40. The method of claim 33, wherein the biorthogonal filter bank is used for segmentation-based audio coding, the finite length signal being a segment of a longer finite length signal.

41. A method for designing boundary filters of a biorthogonal filter bank operable to process a finite length signal that comprises a left boundary and a right boundary, the biorthogonal filter bank comprising a synthesis filter bank and an analysis filter bank, the synthesis filter bank comprising one or more left boundary filters, one or more right boundary filters, and one or more steady-state synthesis filters, the analysis filter bank comprising one or more left boundary filters, one or more right boundary filters, and one or more steady-state analysis filters, the method comprising:

generating, from the steady-state synthesis filters, a synthesis matrix representing the synthesis filter bank;

multiplying the synthesis matrix by a permutation matrix to generate a permutated synthesis matrix;

truncating the permutated synthesis matrix to a degree to generate a rectangular truncated synthesis matrix;

selecting a number of left boundary filters and a number of right boundary filters such that, when column vectors corresponding to the number of left boundary filters and the number of right boundary filters are added to the truncated synthesis matrix, the truncated synthesis matrix becomes square, each column vector added to the truncated synthesis matrix lying outside a column space of the truncated synthesis matrix such that the column vector specifies a permissible design for a boundary filter; and calculating the dual, or inverse, of the square synthesis matrix to generate an analysis matrix specifying the left boundary filters, right boundary filters, and steady-state synthesis filters of the analysis filter bank.

42. The method of claim 41, wherein the degree of truncation of the permutated synthesis matrix depends, at least in part, on one or more of a length of an input vector, a number of channels in the biorthogonal filter bank, and a length of two or more original analysis filters.

43. The method of claim 41, wherein the design of a left boundary filter is used as the design of a right boundary filter.

44. The method of claim 41, wherein the analysis filter bank provides sub-band length preservation.

45. The method of claim 41, wherein the boundary filters substantially match the steady-state behavior of an infinite biorthogonal filter bank.

46. The method of claim 41, wherein the boundary filters meet one or more criteria, the criteria comprising one or more of criteria associated with frequency selectivity, criteria associated with coding gain, and criteria associated with a number of vanishing moments.

47. The method of claim 41, wherein the biorthogonal filter bank is used for segmentation-based audio coding, the finite length signal being a finite segment of an infinite length signal.

48. The method of claim 41, wherein the biorthogonal filter bank is used for segmentation-based audio coding, the finite length signal being a segment of a longer finite length signal.

* * * * *